(12) United States Patent  
Ozeki

(10) Patent No.: US 7,814,381 B2  
(45) Date of Patent: Oct. 12, 2010

(54) SEMICONDUCTOR MEMORY DEVICE

(75) Inventor: Seiji Ozeki, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 189 days.

(21) Appl. No.: 11/870,623

(22) Filed: Oct. 11, 2007

(65) Prior Publication Data

US 2008/0089152 A1 Apr. 17, 2008

(30) Foreign Application Priority Data

Oct. 11, 2006 (JP) ............................ 2006-277595

(51) Int. Cl.
G11C 29/00 (2006.01)
G01R 31/28 (2006.01)
(52) U.S. Cl. ...................... 714/719; 714/718; 714/736
(58) Field of Classification Search ................ 714/718, 714/719, 735, 736, 819; 365/200, 201, 189.011
See application file for complete search history.

(56) References Cited

U.S. PATENT DOCUMENTS 4,868,823 A * 9/1989 White et al. ................ 714/720
6,189,121 B1 2/2001 Ogawa
6,304,502 B1 * 10/2001 Watanabe et al. ........... 365/201
7,558,993 B2 * 7/2009 Park et al. ................... 714/722

FOREIGN PATENT DOCUMENTS

JP 09-166646 6/1997
JP 2001-332099 11/2001

* cited by examiner

Primary Examiner—Phung M Chung
(74) Attorney, Agent, or Firm—Young & Thompson

(57) ABSTRACT

A semiconductor memory device is adapted so that access time can be measured accurately when the device is in a test mode. A read or write operation of a memory array in the normal mode is performed in accordance with a first signal, a read or write operation of the memory array in the test mode is performed in accordance with a second signal, and a test of a plurality of items of output data from the memory array is conducted in the test mode and results of the test are output. It is so arranged that a desired test is conducted in the test mode based upon a third signal unrelated to the first signal and second signal.

19 Claims, 14 Drawing Sheets

<TRUTH TABLE>

| OPERATING MODE | BUNRI | TEST MODE SIGNAL | ICLK SOURCE SIGNAL |
|---|---|---|---|
| NORMAL MODE | "L" | φ | SELECT CLK |
| DA MODE | "H" | "L" | SELECT TCLK0 |
| ACCESS MEASURING MODE | "H" | "H" | SELECT TACC0 |

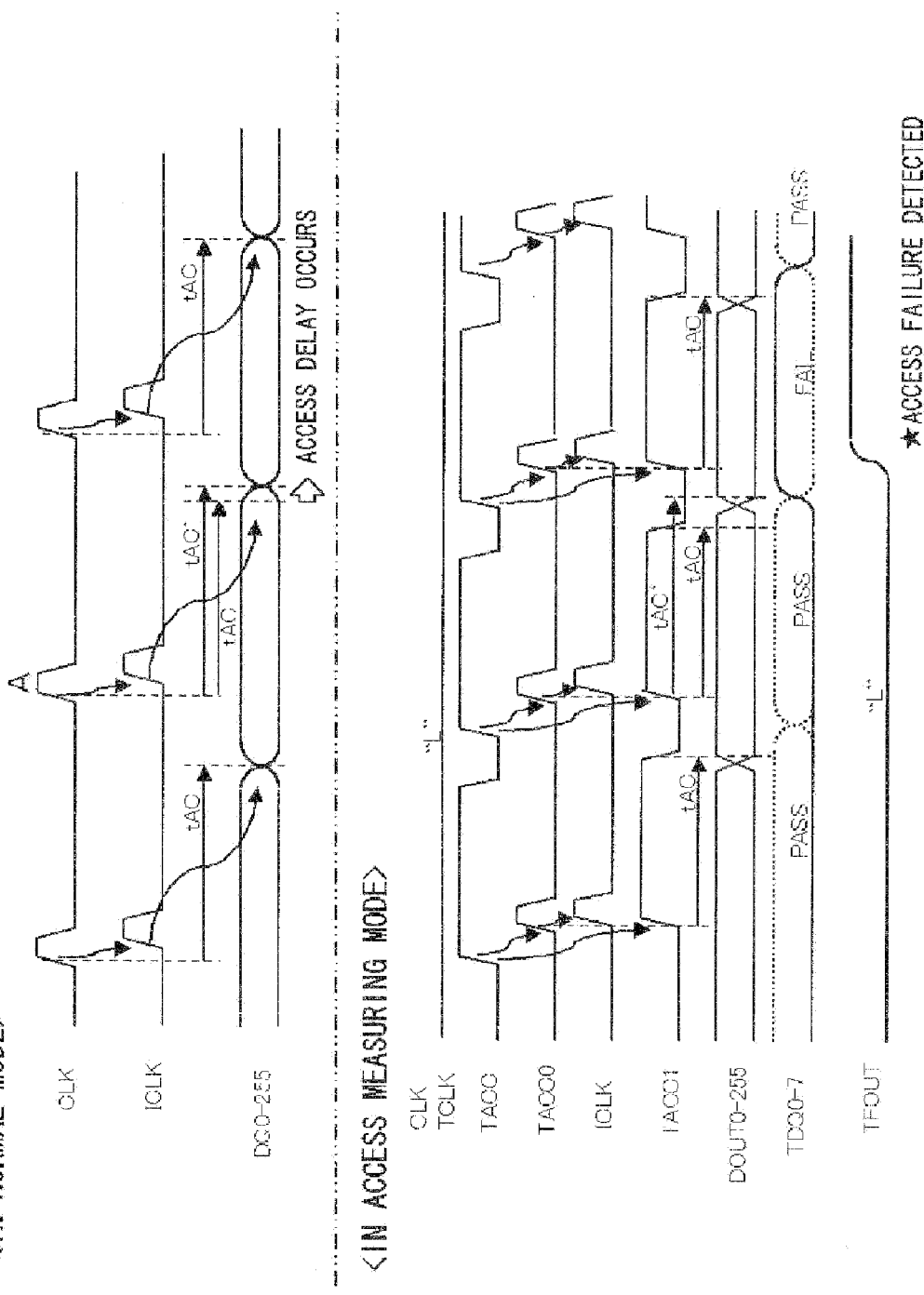

FIRST I/O COMPRESSION CIRCUIT

SECOND I/O COMPRESSION CIRCUIT

SEMICONDUCTOR MEMORY DEVICE

REFERENCE TO RELATED APPLICATION

This application is based upon and claims the benefit of the priority of Japanese patent application No. 2006-277595, filed on Oct. 11, 2006, the disclosure of which is incorporated herein in its entirety by reference thereto.

FIELD OF THE INVENTION

This invention relates to a semiconductor memory device equipped with a memory macro. More particularly, the invention relates to a semiconductor device in which accurate access time can be measured in a test mode.

BACKGROUND OF THE INVENTION

Methods of testing a memory macro in a semiconductor memory device equipped with a memory macro generally include a DA (Direct Access) mode for directly testing a memory macro cell using an LSI tester, and a BIST (Built-In Self-Test) mode for testing a memory macro cell by relying upon a tester function, which is provided within the cell, without using an LSI tester. There is a demand that the access time of a memory macro cell can be measured using these test methods.

For example, Japanese Patent Kokai Application No. JP-P2001-332099A discloses a semiconductor integrated circuit device (see FIG. 10) in which a Design for Test circuit (DFT) of each DRAM macro cell (DRAM) is furnished with a function for selectively placing a test control signal TACC at a valid level at the time of a test operation for access evaluation. Each DRAM macro cell includes a memory control circuit CTL and a multiplexer MXL. In accordance with a clock signal CLKN serving as a start-up control signal of the macro cell, the memory control circuit CTL generates an internal control signal COLC having a prescribed time relationship with respect to the clock signal. The multiplexer MXL sends the internal control signal COLC to an output data latch OL as an output latch control signal OLC at the time of ordinary operation in which the test control signal TACC is placed at an invalid level, and sends an output latch control signal TOLC, which is for testing purposes and is supplied from an external test device TST, to the output data latch OL as the output latch control signal OLC at the time of the above-mentioned test operation in which the test control signal is placed at the valid level.

In JP-2001-P332099A, access time is measured using the clock signal CLKN and the output latch control signal TOLC for testing purposes. At the time of normal operation, the output data latch OL is controlled by the internal control signal COLC generated from the clock signal CLKN. At the time of the test operation, however, the output latch control signal TOLC for testing is caused to be input as is to the output data latch OL by the test control signal TACC generated from the clock signal CLKN. As a result, the output data latch OL determines the output data at the rising edge of the output latch control signal TOLC for testing purposes, and delivers this output data to a data output terminal DO. It is possible to evaluate access time when the test operation is performed by checking the normalcy of the data output delivered via the output data latch OL while changing the time relationship of the test output latch control signal TOLC relative to the clock signal CLKN. Access time mentioned here refers to the time from input of the clock signal CLK serving as the start-up control signal from the external test device TST to output of normal data from the data output terminal DO of the DRAM, namely the time from the rising edge of the clock signal CLKN to the rising edge of the output latch control signal TOLC for testing.

Further, Japanese Patent Kokai Application No. JP-A-9-166646 discloses a semiconductor device (see FIG. 11) having a self-test circuit for performing a prescribed logical operation in order to self-test a testable circuit (circuit-to-be-tested) 203. A test signal is applied to the testable circuit 203 by an input-signal generating circuit 201, and a test-result output signal is latched by a latch circuit 208 in response to a strobe input signal (strobe signal). The strobe signal has a period T identical with that of a clock signal supplied to a synchronizing clock input signal terminal. By changing a phase difference $t\theta$, the strobe position is varied. An output signal sequence that is output from the latch circuit 208 is compressed by an output-signal compression circuit 205 in sync with the clock signal, after which the compressed signal and an expected-value signal from an output-signal expected-value generating circuit 206 are compared by a comparator 207. Dynamic pass/fail of the testable circuit 203 is determined via a judgment-value output signal terminal. Here the access time refers to the time from determination of an address signal of the testable circuit 203 (e.g., an SRAM) to read-out of a stored signal from the corresponding address.

Furthermore, a semiconductor memory device equipped with a memory macro of the kind illustrated in FIG. 12 is known. This semiconductor memory device is mounted on a prescribed board (not shown) of a computer system and has logic units LC1 to LC6 and a memory macro MM on a semiconductor substrate CHIP. The latter is provided with a test-mode-dedicated pin TDQ in addition to input and output pins (I/O pins) for input and output data signals. Further, the semiconductor substrate CHIP is provided with a test-mode-dedicated clock signal pin (TCLK pin) and a flag signal pin (TFOUT pin) corresponding to a pass/fail flag dedicated to the test mode. These pins serve as contact terminals for connecting to a tester at the time of a probe test relating to access evaluation.

The logic unit LC1 is a combination of a number of logic-gate cells. Input signals (inclusive of a clock signal CLK and address signal ADD) are applied to the logic unit LC1, and the applied input signals (inclusive of the clock signal CLK and address signal ADD) are output to the memory macro MM. The logic unit LC2 is a combination of a number of logic-gate cells. Input signals (inclusive of a clock signal TCLK and address signal TADD) for testing purposes are applied to the logic unit LC2, which adjusts a prescribed signal in the test input signals and outputs the test input signals to the memory macro MM. In a case where the power-supply voltages of the memory macro MM and logic unit LC2 differ, the logic unit LC2 uses a voltage-adjusting level-shift circuit. If it is necessary to shape the signal waveforms of the memory macro MM and logic unit LC2, then the logic unit LC2 uses a buffer circuit.

In the normal mode, the input signals from the logic unit LC1 are applied to the memory macro MM, which outputs data DQ to a logic unit LC3. More specifically, in the normal mode, when the input signals (inclusive of a clock signal CLK and address signal ADD) are applied to the memory macro MM in the normal mode, a controller CTL activates a memory array MARY based upon the input signals, reads data corresponding the address signal ADD out of a memory cell in the memory array MARY, and supplies data DOUT, which has been read out of the memory array MARY, to output unit DO. The data DQ, which is the result of adjusting the data DOUT in the output unit DO, is output to the logic unit LC3.

In a test mode such as a DA mode, on the other hand, the input signals for testing from the logic unit LC2 are input to the memory macro MM, in response to which the memory macro MM outputs data DQ to the logic unit LC3 and outputs test data TOUT and/or TOUT2 to the logic unit LC4 or logic unit LC5. More specifically, in the test mode, when the test input signals (inclusive of the clock signal TCLK and address signal TADD) are supplied to the memory macro MM, the controller CTL activates the memory array MARY based upon the test input signals, reads data corresponding to the address signal TADD out of a memory cell in the memory array MARY, and supplies the data DOUT, which has been read out of the memory array MARY, to the output unit DO and to a DFT (Design For Test) circuit. The data DQ, which is the result of adjusting the data DOUT in the output unit DO, is output to the logic unit LC3. The test data TOUT and/or TOUT2, which is the result of determining whether or not the data DOUT has passed a prescribed standard test, is output to the logic unit LC4 or logic unit LC5 by the DFT circuit.

Accordingly, the normal input signals and the test input signals are input to the controller CTL, and it is so arranged that the mode is switched over to the normal mode or test mode depending upon whether or not a test mode signal is present in the test input signals. Further, the memory macro MM is equipped with the DFT circuit as a testing circuit (DA-mode or BIST-mode circuit). The data DOUT read out of the memory array MARY is input to the DFT circuit, in response to which the DFT circuit compresses the data DOUT, determines whether or not the compressed data DOUT passes the prescribed standard test, outputs the test data TDQ to the exterior of the reference substrate CHIP via the logic unit LC4, and outputs a flag signal TFOUT corresponding to a pass/fail flag to the exterior of the semiconductor substrate CHIP via the logic unit LC5.

The logic unit LC3 is a combination of a number of logic-gate cells. The output signal (inclusive of data DQ) from the memory macro MM is input to the logic unit LC3, which responds by producing an output signal (inclusive of data DQ). The logic unit LC4 is a combination of a number of logic-gate cells. The test data TOUT from the memory macro MM (DFT circuit) is input to the logic unit LC4, which responds by outputting the adjusted data TDQ. The logic unit LC5 is a combination of a number of logic-gate cells. The test data TOUT2 from the memory macro MM (DFT circuit) is input to the logic unit LC5, which proceeds to output the adjusted flag signal TFOUT. In a case where the memory macro MM and logic units LC4, LC5 have different power-supply voltages, the logic units LC4 and LC5 use voltage-adjusting level-shift circuits. If it is necessary to shape the signal waveforms of the memory macro MM and logic units LC4, LC5, then the logic units LC4 and LC5 use buffer circuits. The logic unit LC6 is a cluster of logic circuits constituting a portion other than a portion relating to the memory macro MM. The logic unit LC6 includes a SRAM macro or ROM, PLL, etc.

The details of the memory macro MM shown in FIG. 12 are as illustrated in FIG. 13. In a case where the memory macro MM is one having a number (e.g., 256) of inputs and outputs, providing TDQ pins in a number equivalent to the number of DQ pins is impossible in view of a constraint on the number of pins of the semiconductor substrate CHIP. Accordingly, several (e.g., eight) of these pins are provided.

In the read-out operation in the normal mode, the clock signal CLK (or access signal) from outside the memory macro MM is input to the memory macro MM, and the data DQ is read out of the memory cell in the memory array MARY corresponding to the address signal that is input simultaneously. Data DQ0 to DQ255 is output from the DQ pins.

In the DA mode, the test-mode-dedicated clock signal TCLK is used instead of the clock signal CLK, and the test-mode-dedicated address signal TADD is used instead of the address signal ADD. In the read-out operation in the DA mode, a clock signal TCLK0 from the logic unit LC2 is input to the memory macro MM, and data is read out of the memory cell in the memory macro MM corresponding to the address signal TADD input simultaneously. The data is output to the eight TDQ pins. Usually, data DOUT0 to DOUT255 extracted from nodes of the wiring between the memory array MARY and the output unit DO is input to the DFT circuit. When the data DOUT0 to DOUT255 enters the DFT circuit, it is compressed to eight items of data TOUT10 to TOUT 17 by a first I/O compression circuit (see FIG. 14A). The test data TDQ, which is the result of determining whether the items of compressed data TOUT10 to TOUT 17 are identical or not, is output from each of the TDQ pins. If DOUT0 to DOUT255 are identical, i.e., if they agree, then "0" is output from each of the TDQ0 to TDQ7 pins, thereby indicating "pass". If they are not identical, i.e., if they do not agree, then "1" is output from each of the TDQ0 to TDQ7 pins, thereby indicating "fail". As a result, the compressed data TOUT10 to TOUT 17 is processed in units of the external input addresses. In the DA mode, therefore, not only pass/fail but also good/faulty addresses can be ascertained.

In relation to the BIST mode, the semiconductor substrate CHIP is provided with the dedicated TFOUT pin for the flag signal TFOUT corresponding to the pass/fail flag. In the BIST mode, the inputs from outside the memory macro MM are only the test-mode-dedicated clock signal TCLK and initialization signal; the address signal is generated internally. In the read-out operation in the BIST mode, the test-mode-dedicated clock signal TCLK0 is input, data TOUT10 to TOUT17 that is output to the TDQ pins is extracted and the data TOUT10 to TOUT17 is compressed to a single item of compressed data TOUT2 by a second I/O compression circuit (see FIG. 4B) based upon an internal clock delay signal ICLKD and initialization signal INIT. Whether or not the items of compressed data TOUT10 to TOUT 17 are identical or not is output from the TFOUT terminal as a pass/fail flag. If these items of data are identical, i.e., if they agree, then "0" is output from the TFOUT pin, thereby indicating "pass". If these items of data are not identical, i.e., if they do not agree, then "1" is output from the TFOUT pin, thereby indicating "fail". The compressed data TOUT10 to TOUT17 at the pins TDQ0 to TDQ7 is subjected to overwrite processing. Therefore, if agreement continues, "0"s continue to be output. When there is non-agreement, "1"s continue to be output. In other words, ascertaining a faulty address is impossible and all that can be ascertained is merely pass/fail of the memory macro MM. The internal clock delay signal ICLKD is a signal obtained by delaying the internal clock signal ICLK and is generated by an ICLKD initial stage (not shown) based upon the internal clock signal ICLK from the controller CTL (ICLK initial stage). Further, the initialization signal INIT is a signal that is in phase with the initialization signal included in the test input signals and is generated by an INIT initial stage (not shown) based upon the initialization signal included in the test input signals.

SUMMARY OF THE DISCLOSURE

The following analyses are given by the present invention. The entire disclosure of JP-P2001-332099A and JP-A-9-166646 are incorporated herein by reference thereto.

In JP-P2001-332099A (see FIG. 10) and JP-A-9-166646 (see FIG. 11), measurement of access time is possible, as described above. However, if the I/O pins (input/output terminals) are large in number, measuring the outputs at the DQ pins directly is impossible as long as the semiconductor substrate is not provided with a large number of DQ pins. Further, in JP-P2001-332099A (see FIG. 10), measuring the outputs at the DQ pins is impossible without an input of the clock signal CLKN used in the normal mode.

With regard to FIGS. 12 and 13, the actual access time of the memory macro MM is the time it takes for data to be output from entering an input pin (CLK pin) to a DQ pin. With regard to input of the clock signals CLK, TCLK0 in the DA mode or BIST mode of FIGS. 12 and 13, the signals reach the memory macro MM from the input pin and TCLK pin via the logic units LC1, LC2. Further, the outputs of DQ, TDQ and TFOUT from the memory macro MM reach the output pins, TDQ pins and TFOUT pin of the semiconductor substrate CHIP via the logic units LC3, LC4, LC5. Accordingly, when measurement is performed using a memory tester, what is seen is an access time that is much larger than the actual access time.

Further, since the logic units LC4 of the respective TDQ pins in FIGS. 12 and 13 are not necessarily uniform, it is conceivable that access will appear slow even though it is actually fast, or that access will appear fast even though it is actually slow. In other words, with FIGS. 12 and 13, the access time of the memory macro MM cannot be measured accurately.

With reference to the timing chart of FIG. 15, the area above the two-dot phantom line represents operation in the normal mode. When clock signal CLK is input, the internal clock signal ICLK is output from the controller CTL (CTL initial stage), the memory array MARY is activated and data is output from the DQ pins. This requires a prescribed access time tAC. For example, if data DQ accessed at time A in FIG. 15 has its access time delayed beyond tAC and requires time tAC', normal data will be output following time tAC' from the clock signal CLK at time A.

If the same address in this case is accessed in the DA mode, the area below the two-dot phantom line will represent operation. The test-mode-dedicated clock signal TCLK is input and the data DOUT0 to DOUT255 appears at the DOUT0 to DOUT255 pins approximately tAC later. With access at time A, normal data DOUT0 to DOUT255 appears at the DOUT0 to DOUT255 pins approximately tAC' later, inclusive of data DQ requiring time tAC'. As illustrated in FIG. 13, in a case where whether the items of compressed data TOUT10 to TOUT17 are identical or not is output from each of the TDQ pins, if ultimately correct data DOUT0 to DOUT255 have been read out to the DQ0 to DQ255 pins regardless of the size of tAC, the compressed data TOUT10 to TOUT17 that are output from the first I/O compression circuit output an "agreement" flag. Therefore, the TDQ pins output "0", which is indicative of "pass", and output of "0" continues. In other words, measurement of access time is impossible in the DA mode of FIGS. 12 and 13.

In a case where the system adopted in FIG. 13 is one in which the compressed data TOUT10 to TOUT17 per se are output from the respective TDQ0 to TDQ7 pins, the data DOUT0 to DOUT255 at the DOUT0 to DOUT255 pins are output from the TDQ0 to TDQ7 pins. After the correct data has eventually been read out to DOUT0 to DOUT255, therefore, a "0" output or "1" output is obtained and the time at which the data changes over appears in such a manner that it can be recognized as access time. In relation to the data DOUT0 to DOUT255, however, the electrical distance from memory array MARY to the TDQ0 to TDQ7 pins is long. Consequently, the data TDQ0 to TDQ7 appear at the TDQ0 to TDQ7 pins after a considerable delay from tAC or tAC' on the lower area of FIG. 15. In other words, since the electrical distance differs for every one of the TDQ0 to TDQ7 pins, the difference between tAC and tAC' will not necessarily appear as is at the TDQ0 to TDQ7 pins. Even if the pass/fail decision is rendered at a time that is the result of adding a prescribed time to tAC, it is possible that access that satisfies tAC will receive a "fail" determination or that access that does not satisfy tAC will receive a "pass" determination. Accordingly, in the DA mode of FIGS. 12 and 13, access time cannot be measured accurately.

Accordingly, it is an object of the present invention to so formulate it that access time can be measured accurately in the test mode of a semiconductor memory device.

According to a first aspect of the present invention, there is provided a semiconductor memory device in which a read or write operation in a normal mode of a memory array is performed in accordance with a first signal; a read or write operation in a test mode of the memory array is performed in accordance with a second signal; and a test of a plurality of items of output data from the memory array is conducted in the test mode and results of the test are output, wherein it is so configured that a desired test is conducted in the test mode based upon a third signal which is unrelated to the first signal and second signal.

The semiconductor memory device according to the present invention preferably includes: a first initial-stage circuit that generates a prescribed signal based upon the third signal and outputs a prescribed signal to the memory array; a replica unit that buffers and outputs output data from the memory array; a latch circuit that latches output data from the replica unit based upon the prescribed signal generated by the first initial-stage circuit; a first I/O compression circuit that compresses the output data from the latch circuit to a prescribed number of items of data, determines whether the compressed items of data are identical or not identical with one another and outputs test data resulting from the determination; and a second I/O compression circuit that compresses output data from the first I/O compression circuit to a single item of data and outputs, as a pass/fail flag signal, whether the compressed data is identical or not identical with an expected value.

The device may further comprises a second initial-stage circuit to which the first and second signals are input; wherein the first initial-stage circuit generates a fourth signal based upon the third signal;

the fourth signal is input to the second initial-stage circuit; and the second initial-stage circuit is configured to output the fourth signal to the memory array when the desired test is conducted.

The device may further comprises an output unit that buffers the output data of the memory array and outputs the data to the exterior of the memory array; wherein it is so configured that an access path from an input pin of the second signal to the latch circuit when the test mode is in effect is electrically equal in length to an access path from the input pin of the second signal to an output pin of output data of the output unit when the normal mode is in effect.

The first initial-stage circuit may be such that generates a fifth signal based upon the third signal, and the fifth signal is input to the latch circuit.

The third signal may be an "H" pulse signal; the fourth signal may be a one-shot signal serving as an internal clock signal timed to an "H" edge of the third signal; and the fifth signal may be a pulse signal having an "H" pulse width identical with that of the third signal.

It is possible for access time when the desired test is conducted to be expressed by the "H" pulse width of the third signal. Alternatively, it is possible for access time when the desired test is conducted to be measured by changing, in terms of time, an "L" edge of the third signal.

It is preferred that the semiconductor memory device according to the present invention includes: a third initial-stage circuit that generates a prescribed signal based upon the third signal; a fourth initial-stage circuit that generates a prescribed signal based upon an output signal from the third initial-stage circuit; a replica unit that buffers and outputs output data from the memory array; a latch circuit that latches output data from the replica circuit based upon a prescribed signal generated by a first initial-stage circuit; a first I/O compression circuit that compresses the output data from the latch circuit to a prescribed number of items of data, determines whether the compressed items of data are identical or not identical with one another and outputs test data resulting from the determination; and a second I/O compression circuit that compresses output data from the first I/O compression circuit to a single item of data and outputs, as a pass/fail flag signal, whether the compressed data is identical or not identical with an expected value.

According to a second aspect of the present invention, there is provided a semiconductor memory device comprising: a memory array; latch circuits that latch data that has been read out of the memory array; a controller that sets the operating mode of the memory array; a compression circuit that consolidates outputs from a plurality of the latch circuits into a single output; and a test access circuit that outputs a test access signal that controls the latch circuits; wherein the test access circuit receives an externally input test signal and causes the controller to generate a one-shot pulse that conforms to the test signal.

The meritorious effects of the present invention are summarized as follows.

In accordance with the present invention, access time can be expressed by the pulse width of the third signal. Therefore, by generating the third signal as an "H" pulse using a memory tester and varying the pulse width of this signal, the access time of the memory macro can be measured accurately, and memory access is possible solely by the third signal irrespective (independently) of the first and second signals. Further, a fourth signal serving as a one-shot signal is generated from the third signal, and the fourth signal is used as an internal clock signal. Even though the pulse width of the third signal is varied, therefore, memory-macro access is unaffected. Since data changeover timing is not measured at the locations of the pins provided on the semiconductor substrate, there is no influence from any logic unit outside the memory macro.

BRIEF DESCRIPTIONS OF THE DRAWINGS

FIG. 6 is a timing chart illustrating the operation of the semiconductor memory device according to the first embodiment;

Figure 14A:
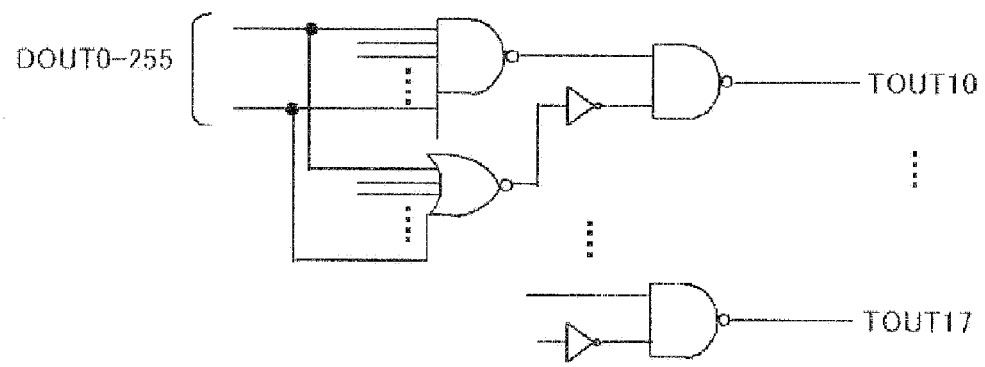
Figure 14B:
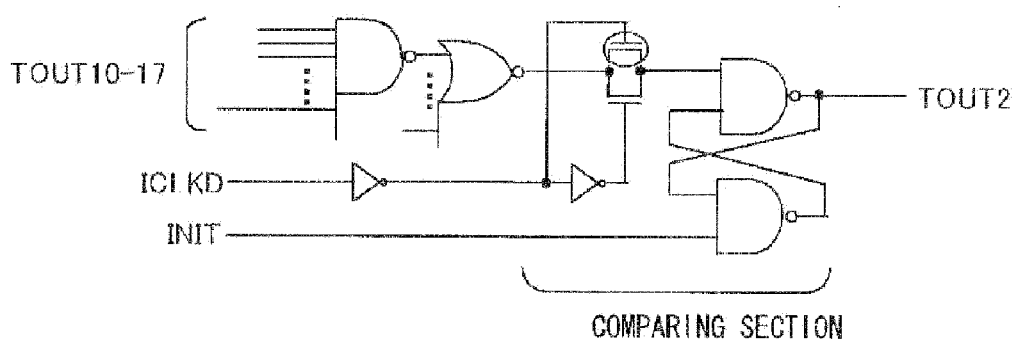
Figure 15:
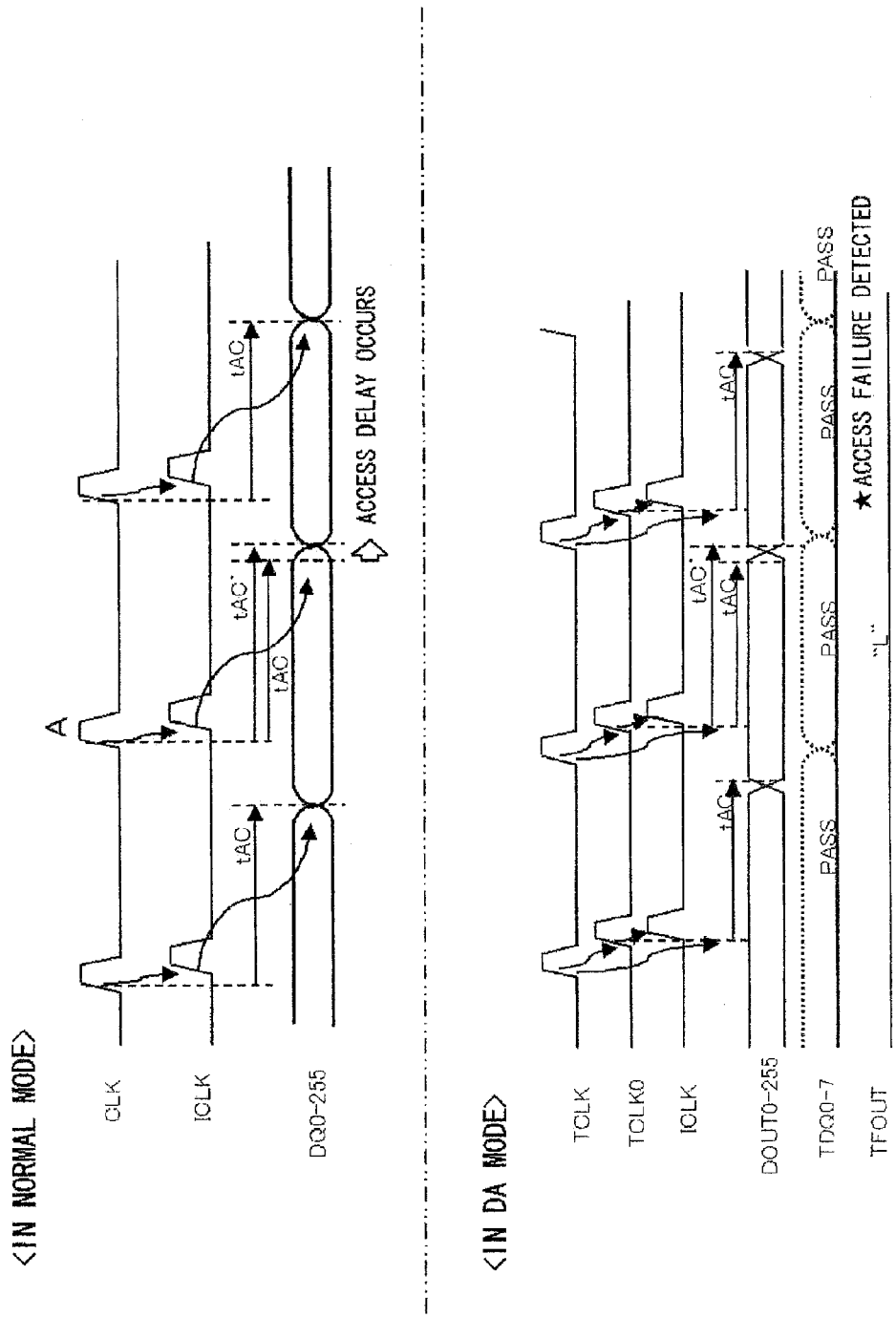

FIGS. 14A and 14B are circuit diagrams schematically illustrating the configurations of first and second I/O compression circuits, respectively, of the memory macro in the semiconductor memory device according to the prior art; and FIG. 15 is a timing chart illustrating the operation of the semiconductor memory device according to a memory macro in a semiconductor memory device according to the prior art as analyzed by the present invention.

PREFERRED MODES OF THE INVENTION

First Embodiment

Figure 1:
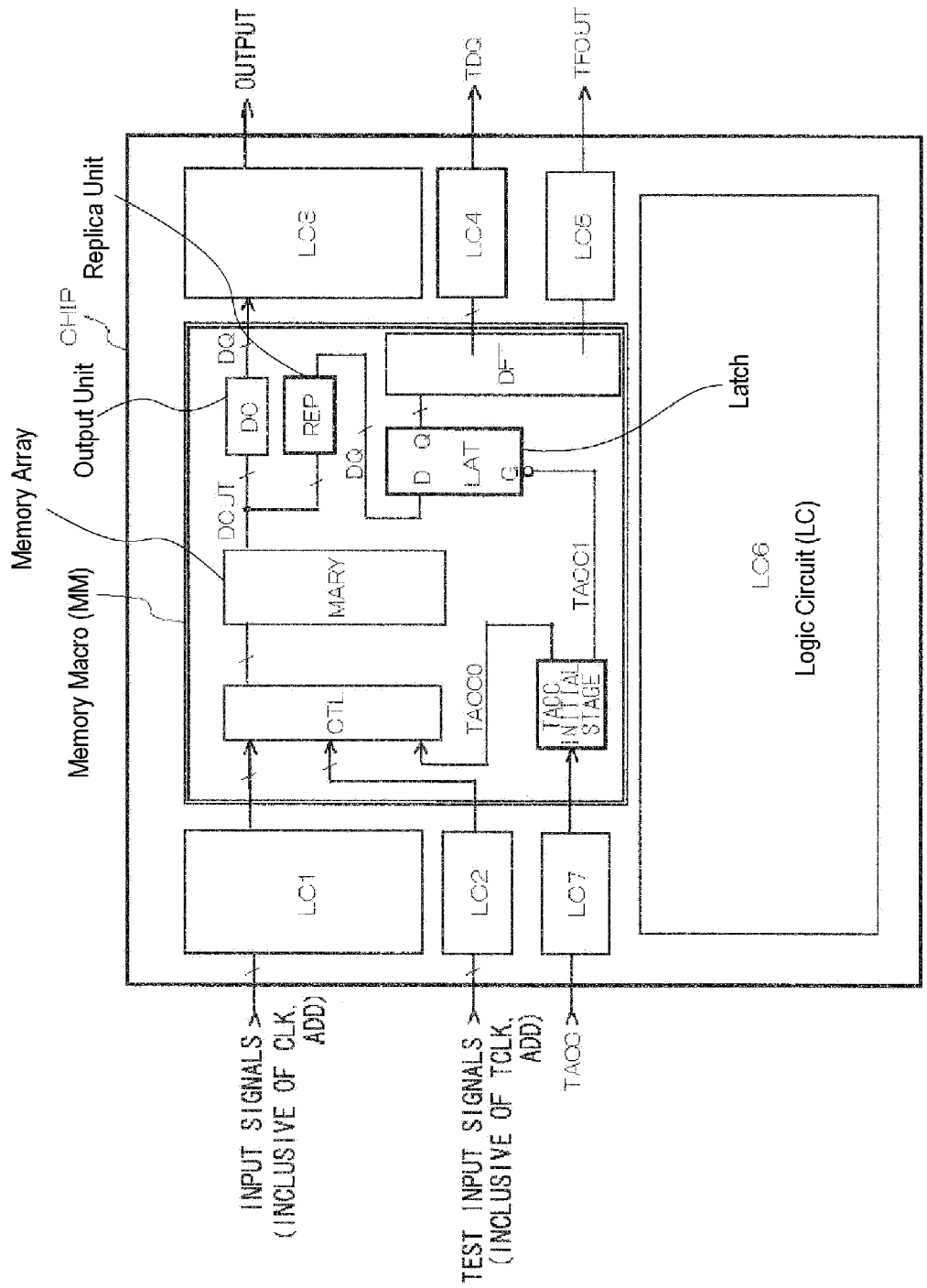
FIG. 1 is a block diagram schematically illustrating the configuration of a semiconductor memory device according to a first embodiment of the present invention.
Figure 2:
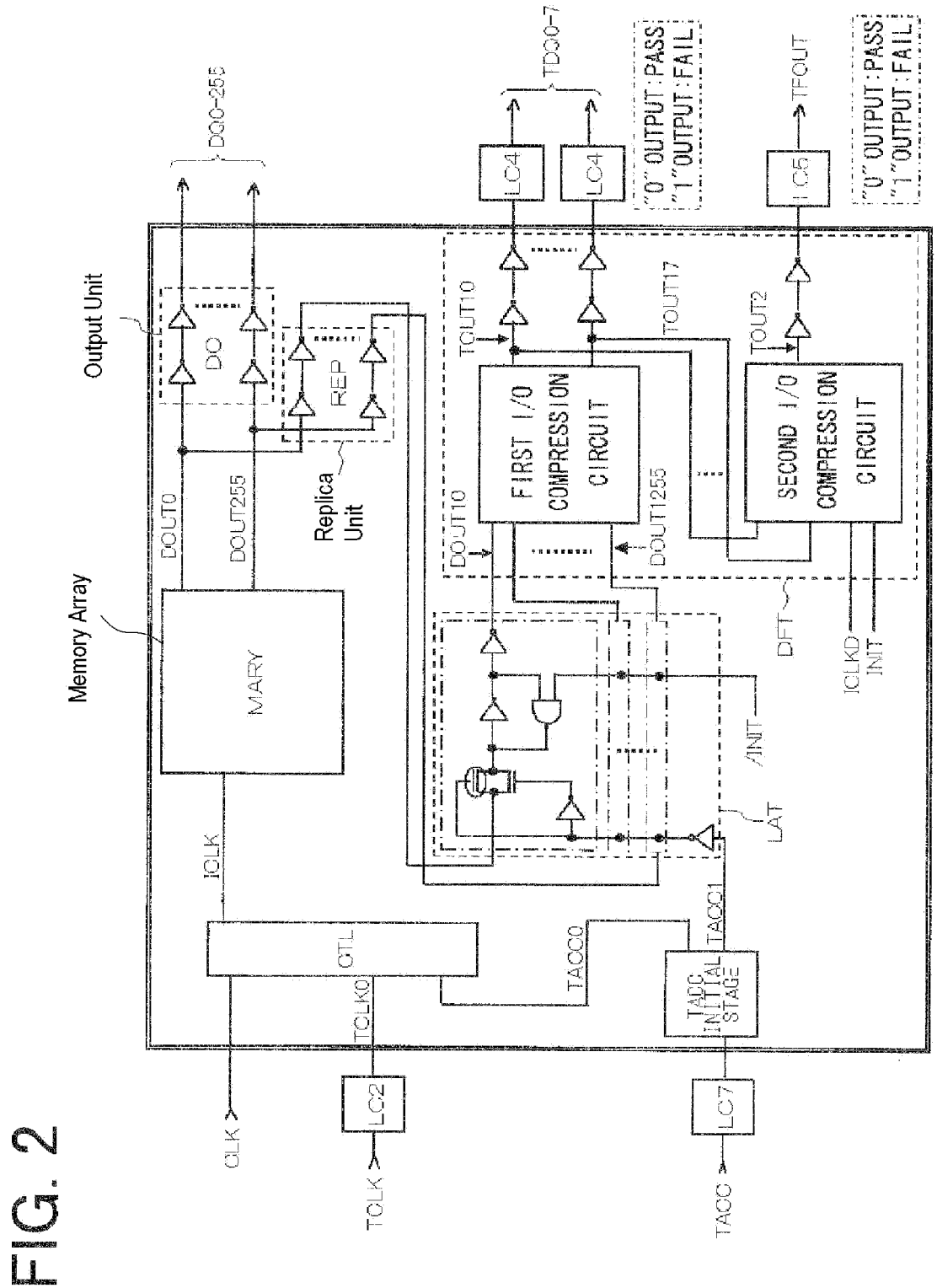
FIG. 2 is a block diagram schematically illustrating the configuration of a memory macro in the semiconductor memory device according to the first embodiment.
Figure 3:
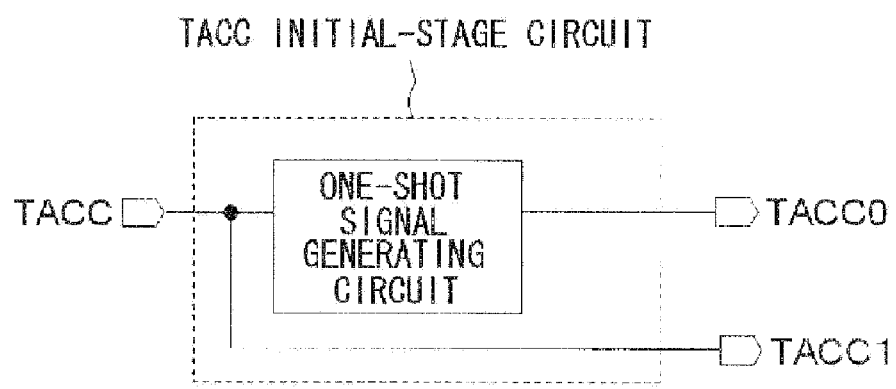
FIG. 3 is a block diagram schematically illustrating the configuration of a TACC initial-stage circuit in the semiconductor memory device according to the first embodiment.
Figure 4:
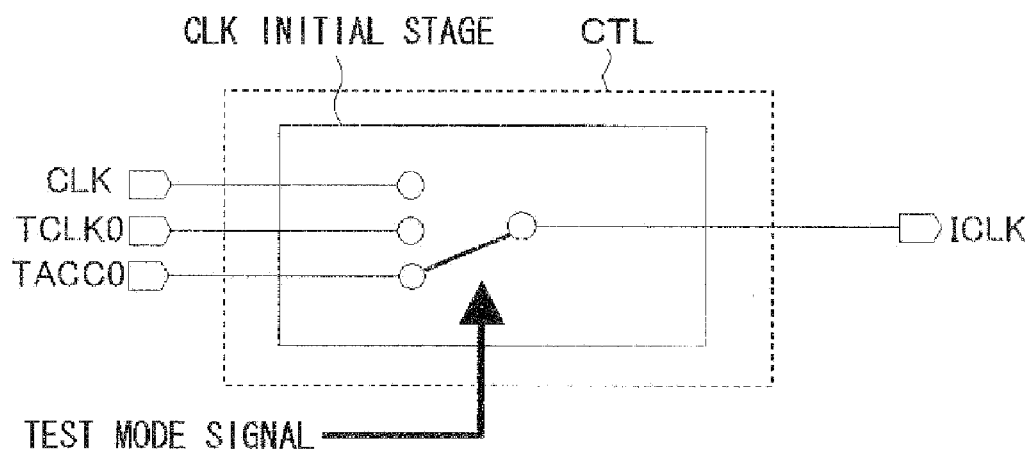
FIG. 4 is a block diagram schematically illustrating the configuration of a controller in the semiconductor memory device according to the first embodiment.
Figures 5A, 5B:
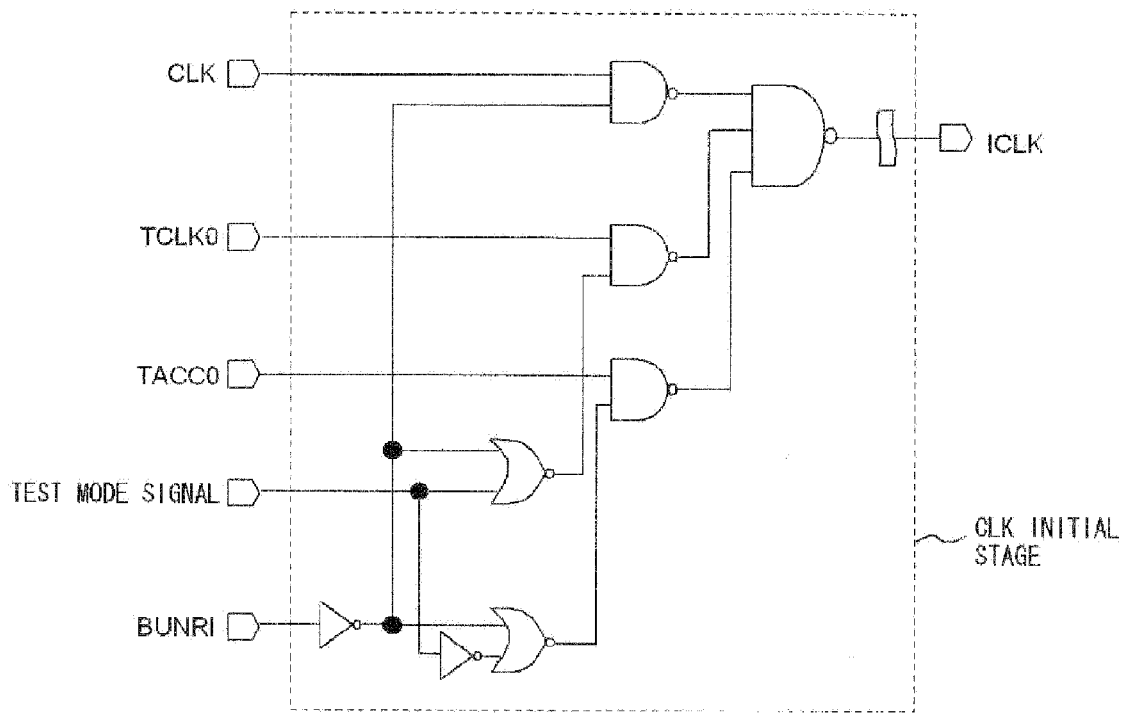
FIG. 5A is a circuit diagram schematically illustrating a CLK initial-stage circuit in the semiconductor memory device according to the first embodiment.
FIG. 5B is a truth table associated with this circuit.

FIG. 1 is a block diagram schematically illustrating the configuration of a semiconductor memory device according to a first embodiment of the present invention; FIG. 2 is a block diagram schematically illustrating the configuration of a memory macro in the semiconductor memory device according to the first embodiment; FIG. 3 is a block diagram schematically illustrating the configuration of a TACC initial-stage circuit in the semiconductor memory device according to the first embodiment; FIG. 4 is a block diagram schematically illustrating the configuration of a controller in the semiconductor memory device according to the first embodiment; FIG. 5A is a circuit diagram schematically illustrating a CLK initial-stage circuit in the semiconductor memory device according to the first embodiment; and FIG. 5B is a truth table associated with this circuit.

Figure 12:
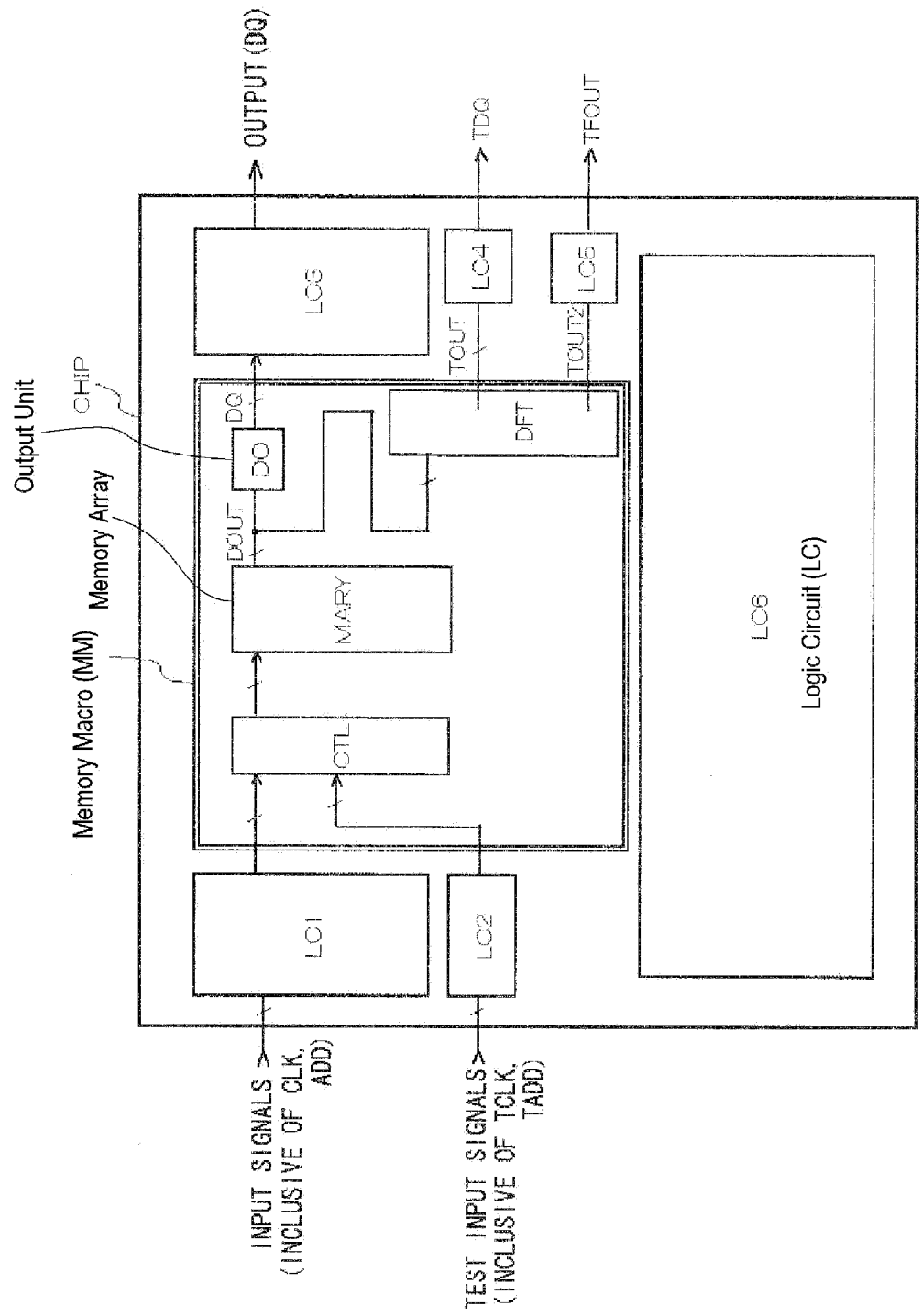
FIG. 12 is a block diagram schematically illustrating the configuration of a semiconductor device according to the prior art as analyzed by the present invention.

With reference to FIG. 1, the semiconductor memory device according to this embodiment is mounted on a prescribed board (not shown) of a computer system and has logic circuits LC1 to LC7 and a memory macro MM on a semiconductor substrate CHIP, by way of example. The first embodiment differs from FIG. 12 in that the semiconductor substrate CHIP is provided with a TACC pin and logic unit LC7, and in that a TACC initial stage, replica unit REP and latch circuit LAT are provided within the memory macro MM.

Besides having an I/O pin for input/output data, the semiconductor substrate CHIP is provided with a test-mode-dedicated clock signal pin (TCLK pin), a TACC pin for inputting an external test signal TACC, a test-mode-dedicated TDQ pin, and a flag signal pin (TFOUT pin) corresponding to a test-mode-dedicated pass/fail flag. These pins serve as contact terminals for connecting to a tester at the time of a probe test relating to access evaluation.

The logic unit LC1 is a combination of a number of logic-gate cells. By applying (supplying) input signals (inclusive of a clock signal CLK and address signal ADD) to the logic unit LC1, the logic unit LC1 outputs the input signals (inclusive of the clock signal CLK and address signal ADD) to the memory macro MM. The logic unit LC2 is a combination of a number of logic-gate cells. By applying input signals (inclusive of a clock signal TCLK and address signal ADD) for testing purposes to the logic unit LC2, this unit adjusts a prescribed signal in the test input signals and outputs the test input signals to the memory macro MM. The logic unit LC7 is a combination of a number of logic-gate cells. By inputting the external test signal TACC to the logic unit LC7, this unit outputs an adjusted external test signal TACC to the memory macro MM. In a case where the memory macro MM and logic units LC2, LC7 have different power-supply voltages, the logic units LC2 and LC7 use voltage-adjusting level-shift circuits. If it is necessary to shape the signal waveforms of the memory macro MM and logic units LC2, LC7, then the logic units LC2 and LC7 use buffer circuits.

The memory macro MM includes the TACC initial stage, controller CTL, memory array MARY, output unit DO, replica unit REP, latch circuit LAT and DFT circuit.

The TACC initial stage is a test access circuit (see FIG. 3) which, on the basis of external test signal TACC that is input from the TACC pin via the logic unit LC7, generates a one-shot signal TACC0, which serves as an internal clock signal, in response to the "H" edge of the external test signal TACC, and outputs the one-shot signal TACC0 to the controller CTL, and which also generates a pulse signal TACC1 (a test access signal) that is in phase with (has the same "H" pulse width as) the external test signal TACC and outputs the pulse signal TACC1 (test access signal) to the latch circuit LAT. It should be noted that the signal TACC0 is input to the controller CTL and is used as the internal clock signal ICLK instead of the clock signal CLK. Further, the signal TACC1 (test access signal) is a signal for controlling the latch circuit LAT and is input to gate G of the latch circuit LAT as negative logic.

The controller CTL controls the memory array MARY based upon the input signals (inclusive of the clock signal CLK and address signal ADD), test input signals (clock signal TCLK0 and address signal TADD) or one-shot signal TACC0. The controller CTL has a CLK initial-stage circuit (see FIGS. 4 and 5) for outputting any one of the signals among the entered clock signal CLK and clock signals TCLK0, TACC0 as the internal clock signal ICLK in accordance with the operating mode. The CLK initial-stage circuit changes over the operating mode based upon the test mode signal and a control signal BUNRI contained in the test input signals. The CLK initial-stage circuit changes over so as to establish the normal mode when the control signal BUNRI is "L" and the test mode signal is "L", establish the DA mode (inclusive of the BIST mode) when the control signal BUNRI is "H" and the test mode signal is "L", and establish the access measuring mode when control signal BUNRI is "H" and the test mode signal is "H" (see FIG. 5B). The CLK initial stage circuit selects the clock signal CLK and outputs it as the internal clock signal ICLK when the normal mode is in effect, selects the clock signal TCLK0 and outputs it as the internal clock signal ICLK when the DA mode is in effect, and selects the one-shot signal TACC0 and outputs it as the internal clock signal ICLK when the access measuring mode is in effect. The control signal BUNRI is a signal that controls the normal mode and test mode in an integrated circuit.

The memory array MARY has a memory cell and a peripheral circuit. The peripheral circuit activated in the memory array MARY based upon the controller CTL reads data out of the memory cell. This data corresponds to the address signal ADD, the address signal TADD or an address signal generated internally. Data DOUT0 to DOUT255 that has been read out is output to the output unit DO and replica unit REP (see FIG. 2). In a case where the one-shot signal TACC0 is selected by the controller CTL, the peripheral circuit is activated in response to TACC0 changing from "L" to "H" and reads data corresponding to the address signal out of the memory cell. The data DOUT0 to DOUT255 that have been read out are output to the output unit DO and replica unit REP, respectively.

The output unit DO is a circuit for buffering the data DOUT0 to DOUT255 from the memory array MARY. For example, a circuit having two stages of serially connected inverters can be used as the output unit DO. The output unit DO outputs the data DOUT0 to DOUT255 from the memory array MARY to the DQ0 to DQ255 pins (see FIG. 2).

The replica unit REP is a circuit for buffering the data DOUT0 to DOUT255 from the memory array MARY in such a manner that the access path from the CLK pin (input pin) to the DQ pin (output pin) of the memory macro MM and the access path from the CLK pin of the memory macro MM to the latch circuit LAT will be electrically equal in length. For example, a circuit having two stages of serially connected inverters can be used as the replica unit REP. The replica unit REP outputs the data DOUT0 to DOUT255 from the memory array MARY to the latch circuit LAT as data DQ0 to DQ255 (see FIG. 2).

The latch circuit LAT is a circuit (see FIG. 2) for latching the data DQ0 to DQ255 from the replica unit REP based upon the pulse signal TACC1 from the TACC initial stage and an externally applied initialization signal /INIT. The latch circuit LAT is provided for each of items of data DQ0 to DQ255. The latch circuits output latched data DOUT10 to DOUT1255 to a first I/O compression circuit. A signal that is the result of making the pulse signal TACC1 negative logic (the NOT signal of TACC1) is input to the gate G of each of the latch circuits LAT of the respective items of data DQ0 to DQ255. The initialization inverted signal /INIT is a signal whose phase is opposite to that of the initialization signal included in the test input signals and is generated by an INIT initial stage (not shown) based upon the initialization signal included in the test input signal.

Figure 13:
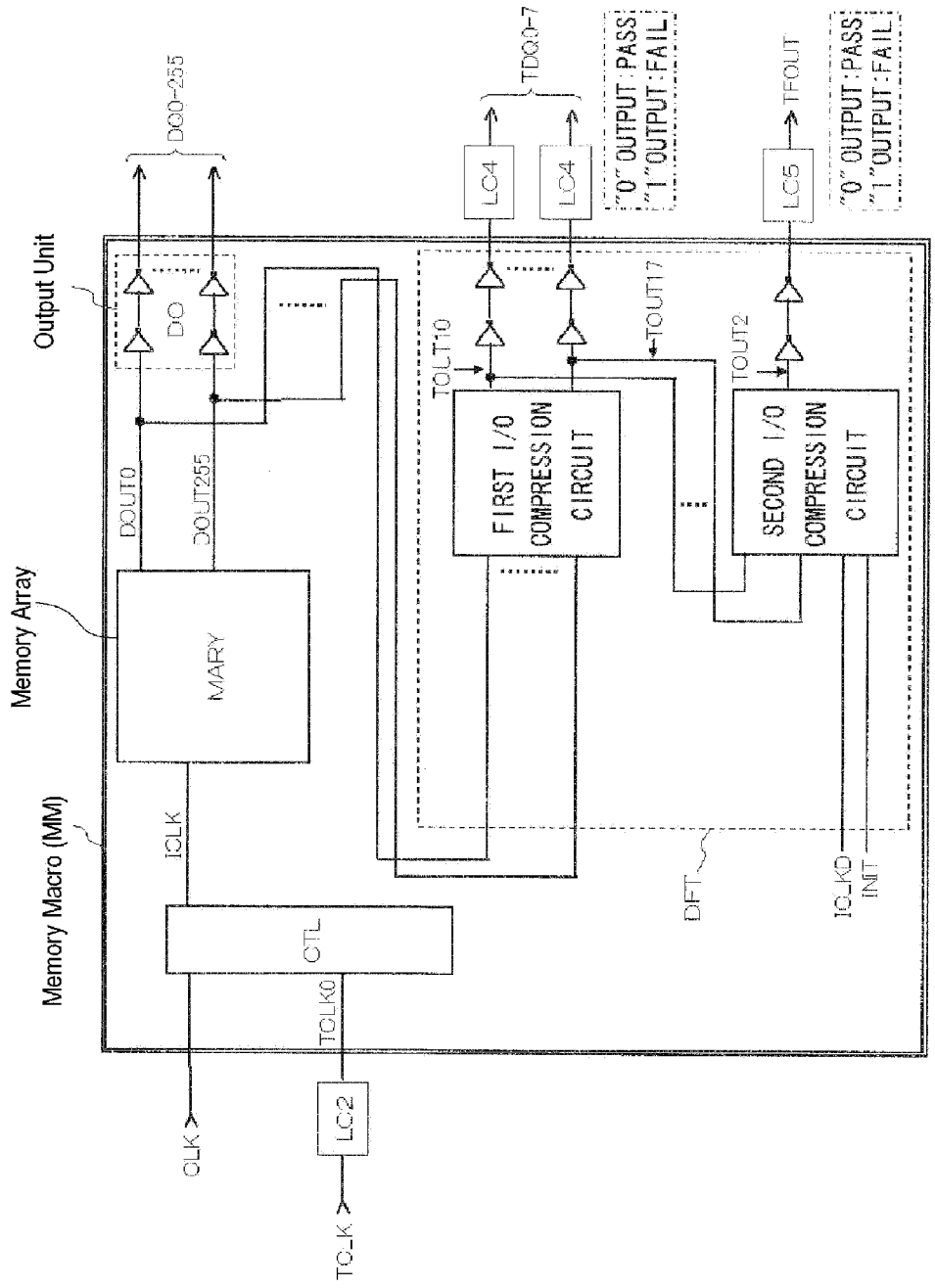
FIG. 13 is a block diagram schematically illustrating the configuration of a memory macro in a semiconductor memory device according to the prior art.

In a manner similar to that of FIG. 13, the DFT circuit has the first I/O compression circuit (See FIG. 14A) to which the data DOUT10 to DOUT1255 from the latch circuits LAT is input. The first I/O compression circuit compresses the data DOUT10 to DOUT1255 to eight items of data TOUT10 to TOUT17 and outputs test data TDQ0 to TDQ7, which is the result of determining whether the items of compressed data TOUT10 to TOUT 17 are identical to one another or not, to the logic units LC4. Further, in a manner similar to that of FIG. 13, the DFT circuit has the second I/O compression circuit (see FIG. 14B) for compressing the data TOUT10 to TOUT 17 from the first I/O compression circuit to a single item of compressed data TOUT2 based upon the internal clock delay signal ICLKD and initialization circuit INIT, and outputting the flag signal TFOUT to the logic unit LC5 as a pass/fail flag indicating whether or not the items of compressed data TOUT10 to TOUT 17 are identical or not. The internal clock delay signal ICLKD is a signal that is the result of delaying the internal clock delay signal ICLK. The signal is generated by an ICLKD initial stage (not shown) based upon the internal clock signal from the controller CTL (ICLK initial stage). Further, the initialization signal INIT is a signal that is in phase with the initialization signal included in the test input signals. This signal is generated by an INIT initial stage (not shown) based upon the initialization signal included in the test input signals.

The logic unit LC3 is a combination of a number of logic-gate cells. The output signal (inclusive of data DQ) from the memory macro MM is input to the logic unit LC3, which responds by producing an output signal (inclusive of data DQ). The logic unit LC4 is a combination of a number of logic-gate cells. The test data TOUT from the memory macro MM (DFT circuit) is input to the logic unit LC4, which responds by outputting the adjusted data TDQ. The logic unit LC5 is a combination of a number of logic-gate cells. The test data TOUT2 from the memory macro MM (DFT circuit) is input to the logic unit LC5, which proceeds to output the adjusted flag signal TFOUT. In a case where the memory macro MM and logic units LC4, LC5 have different power-supply voltages, the logic units LC4 and LC5 use voltage-adjusting level-shift circuits. If it is necessary to shape the signal waveforms of the memory macro MM and logic units LC4, LC5, then the logic units LC4 and LC5 use buffer circuits. The logic unit LC6 is a cluster of logic circuits constituting a portion other than a portion relating to the memory macro MM. The logic unit LC6 includes a SRAM macro or ROM and PLL, etc.

The operation of the semiconductor memory device according to the first embodiment of the present invention will now be described with reference to the drawings. FIG. 6 is a timing chart illustrating the operation of the semiconductor memory device according to the first embodiment.

With regard to the normal mode represented by the area above the two-dot phantom line in FIG. 6, when the clock signal CLK is input from outside the memory macro MM, the internal clock signal ICLK is output from the controller CTL. The internal clock signal ICLK is input to the memory array MARY, and the data DOUT0 to DOUT255 is read out of the memory cell in the memory array MARY corresponding to the address signal ADD that is input at the same time. Each read-out data DQ0 to DQ255 is output from the DQ0 to DQ255 pins via the output unit DO within a fixed access time tAC.

With regard to the access measuring mode (DA mode) represented by the area below the two-dot phantom line in FIG. 6, the one-shot signal TACC0 is generated by the TACC initial stage upon input of the external test signal TACC to the memory macro MM as an "H" pulse. The one-shot signal TACC0 is input to the controller CTL, which proceeds to generate an internal clock signal ICLK. The internal clock signal ICLK is input to the memory array MARY, whereby the read-out operation starts. When each data DOUT0 to DOUT255 is output from the memory array MARY, the data DOUT0 to DOUT255 is input to the latch circuit LAT via the replica unit REP. On the other hand, the pulse signal TACC1 is generated as an "H" pulse in the TACC initial stage. The gate of the latch circuit LAT becomes conductive, therefore, in response to the pulse signal TACC1 changing from "L" to "H". Accordingly, when each data DOUT0 to DOUT255 is output from the memory array MARY while the pulse signal TACC1 is "H", any data DOUT10 to DOUT1255 that has been output from the latch circuit LAT is input to the first I/O compression circuit. However, even if any data DOUT0 to DOUT255 is output from the memory array MARY after the pulse signal TACC1 changes from "H" to "L", the data DOUT10 to DOUT1255 is not output from the latch circuit LAT and is not input to the first I/O compression circuit. As a result, if the external test signal TACC is input as an "H" pulse for the duration of tAC, the test data TDQ0 to TDQ7 that is output via the first I/O compression circuit and logic unit LC4 indicates a "pass" evaluation with regard to the read-out data of access time within tAC, and the test data TDQ0 to TDQ7 indicates a "fail" evaluation with regard to read-out data of an access time that exceeds tAC.

Consider access at time A, just as is the case in FIG. 15. With regard to an access at time A on the upper area of the phantom line in FIG. 6, access time is delayed beyond tAC and access requires time tAC'. If the same address in this case be accessed in the DA mode, the area below the two-dot phantom line will represent the operation. The clock signal TCLK is input and the appearance of the data at DOUT0 to DOUT255 takes place approximately tAC later. With access at time A, all data appear at DOUT0 to DOUT255 approximately tAC' later. Accordingly, if the "H" width of the external test signal TACC be tAC, only some of DQ0 to DQ255 requiring tAC from among DOUT0 to DOUT255 are input to the first I/O compression circuit as DOUT10 to DOUT1255 via the latch circuit LAT. However, if the "H" width of the external test signal TACC be tAC', all of DOUT0 to DOUT255 are input to the first I/O compression circuit as DOUT10 to DOUT1255 via the latch circuit LAT. In a case where whether the items of compressed data from the first I/O compression circuit are identical or not identical is output from each of the TDQ0 to TDQ7 pins, the output from the test data TDQ will indicate "agreement", which is "1", because the data of tAC' will not arrive if the "H" width of TACC is tAC. On the other hand, if the "H" width of TACC be tAC', all of the data will arrive and the output from the test data TDQ will indicate "agreement", which is "0". Accordingly, a "0" output or "1" output is finally obtained depending upon the size of the "H" width of TACC. This means that measurement of access time is possible regardless of the time at which data is output from the TDQ pins.

Also in a case where the compressed data per se is output from the TDQ pins, if the "H" width of TACC be tAC, not all of the DOUT0 to DOUT255 data are input to the inputs DOUT10 to DOUT1255 of the first I/O compression circuit, and thus the desired data, therefore, is not output to the TDQ pins. However, if the "H" width of TACC be tAC', all of the DOUT0 to DOUT255 data are input to DOUT10 to DOUT1255 of the first I/O compression circuit, and therefore the desired data is output to the TDQ pins. In view of the foregoing, access time can be recognized depending upon the size of the "H" width of TACC.

Figure 7:
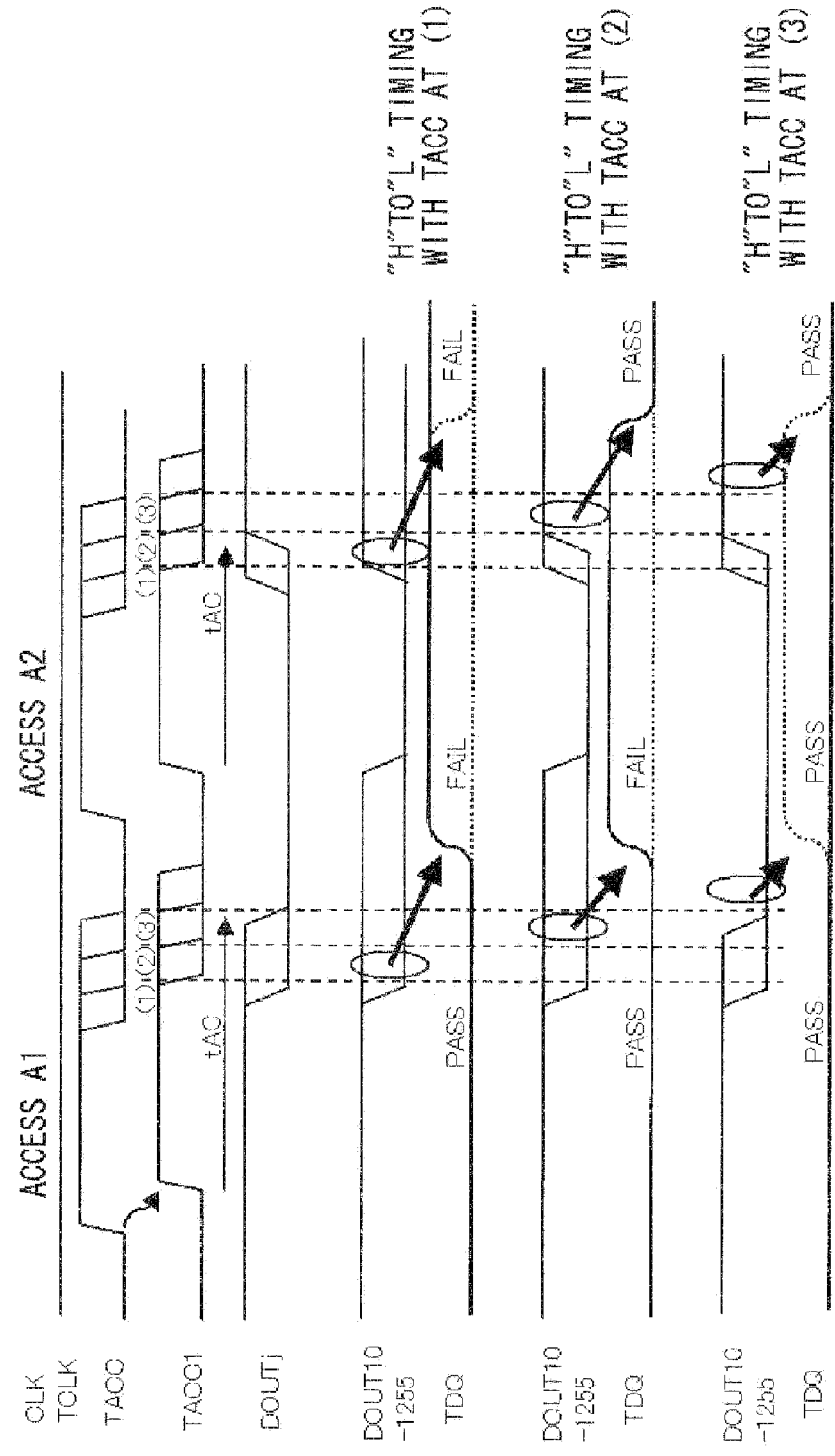
FIG. 7 is a timing chart for describing an access measurement method in the semiconductor memory device according to the first embodiment.

Next, reference will be had to the drawings to describe the access measurement method in the semiconductor memory device according to the first embodiment of the invention. FIG. 7 is a timing chart for describing an access measurement method in the semiconductor memory device according to the first embodiment.

Consider a case where the "H" pulse of TACC be increased from a small width to a large width. The pulse width of TACC is enlarged from (1) to (2) and then from (2) to (3). In other words, the timing of the "H" to "L" change of TACC is delayed (e.g., stepwise). In case of (1), the pulse width is narrower than tAC for both initial access A1 and the next access A2, and thereafter, at any subsequent access An, the pulse width become larger than TAC. Therefore, both "H"/"L" exist in DOUT10 to DOUT1255, which is indicative of "non-agreement" and TDQ outputs "1". Accordingly, it can be judged that tAC is slower than (1). In case of (2), the pulse width is smaller than tAC with the initial access A1 but is larger than tAC with the next access A2. Therefore, with the initial access A1, "H"/"L" exists in DOUT0 to DOUT255, "non-agreement" is indicated and TDQ outputs "1". With the next access A2, however, only "H" exists, "agreement" is indicated and TDQ outputs "0". Accordingly, it can be judged that tAC is close to (2). In case of (3), the pulse width is greater than tAC for both the initial access A1 and next access A2. Therefore, DOUT10 to DOUT1255 are only "L" in the initial access A1, and are only "H" in the next access A2. Accordingly, both are indicative of "agreement" and TDQ outputs "0", which is indicative of "pass". It can be judged that tAC is faster than (3). As a result, it can be said that tAC is a time between (2) and (3). Accordingly, if the spacing (or interval) between (2) and (3) is narrowed, access time can be measured accurately.

In accordance with the first embodiment, the access time can be expressed by the pulse width of TACC. Therefore, by generating TACC as an "H" pulse using a memory tester and varying the pulse width thereof, the access time of the memory macro MM can be measured accurately, and memory access is possible solely by TACC irrespective of (independently from) the CLK and TCLK. Further, the one-shot signal TACC1 is generated from TACC, and this is used as the internal clock signal ICLK. Even though the pulse width of TACC is varied, therefore, access of the memory macro MM is unaffected. Since data changeover timing is not measured at the locations of the pins provided on the semiconductor substrate CHIP, there is no influence from the logic units LC1 to LC7 outside the memory macro MM.

Second Embodiment

Figure 8:
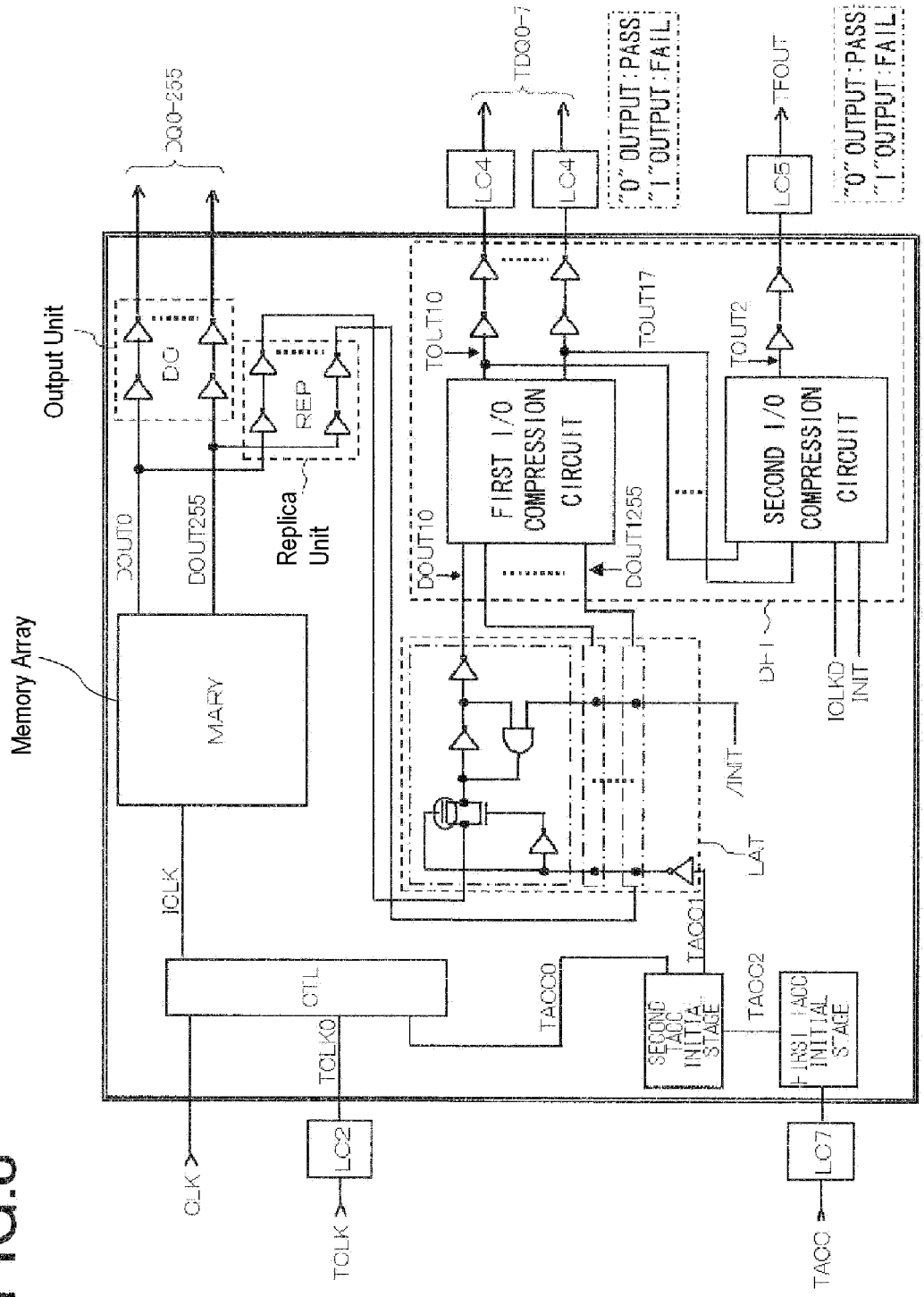
FIG. 8 is a block diagram schematically illustrating the configuration of a memory macro in a semiconductor memory device according to a second embodiment of the present invention.
Figure 9:
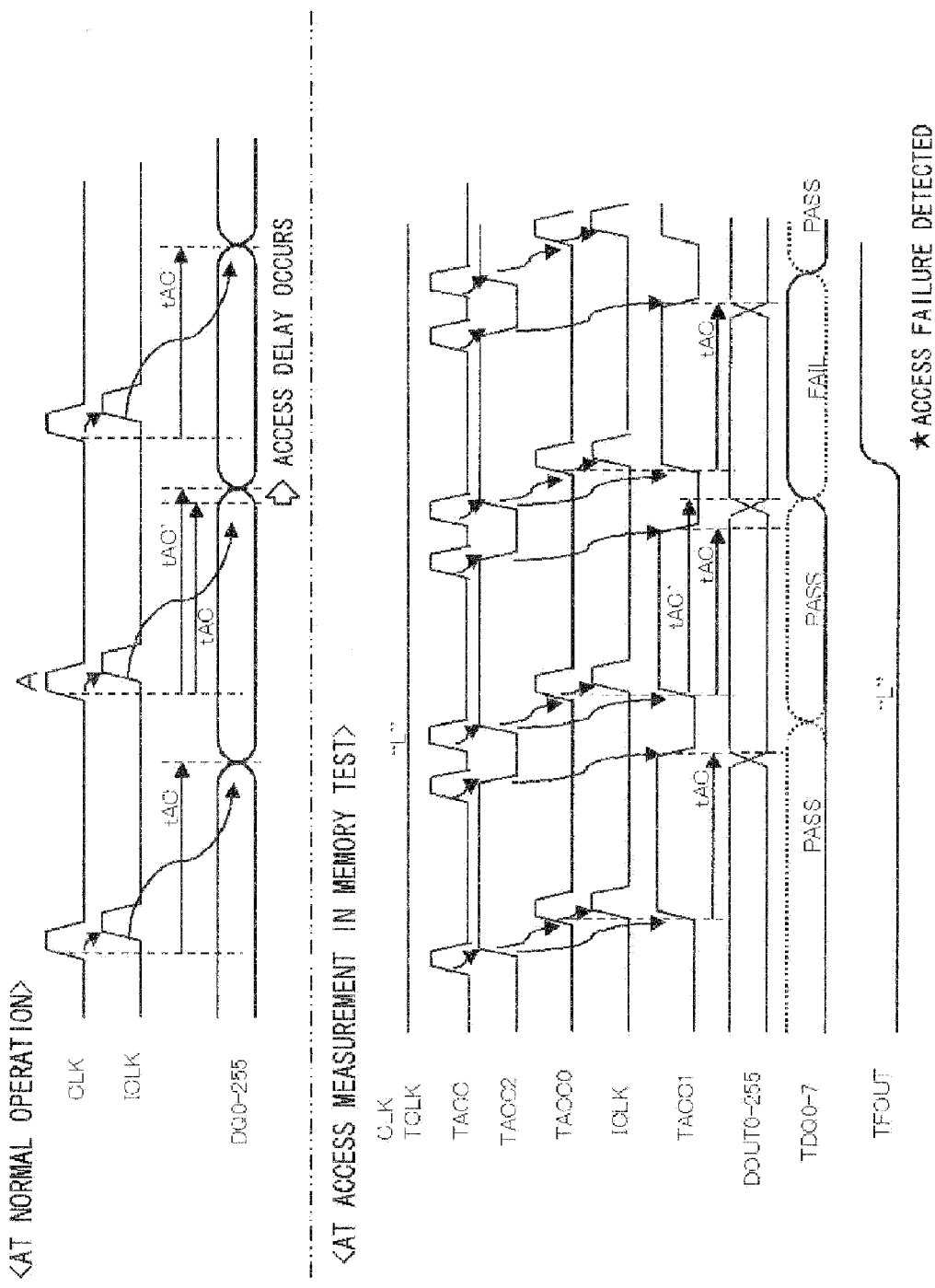
FIG. 9 is a timing chart illustrating the operation of the semiconductor memory device according to the second embodiment.
Figure 10:
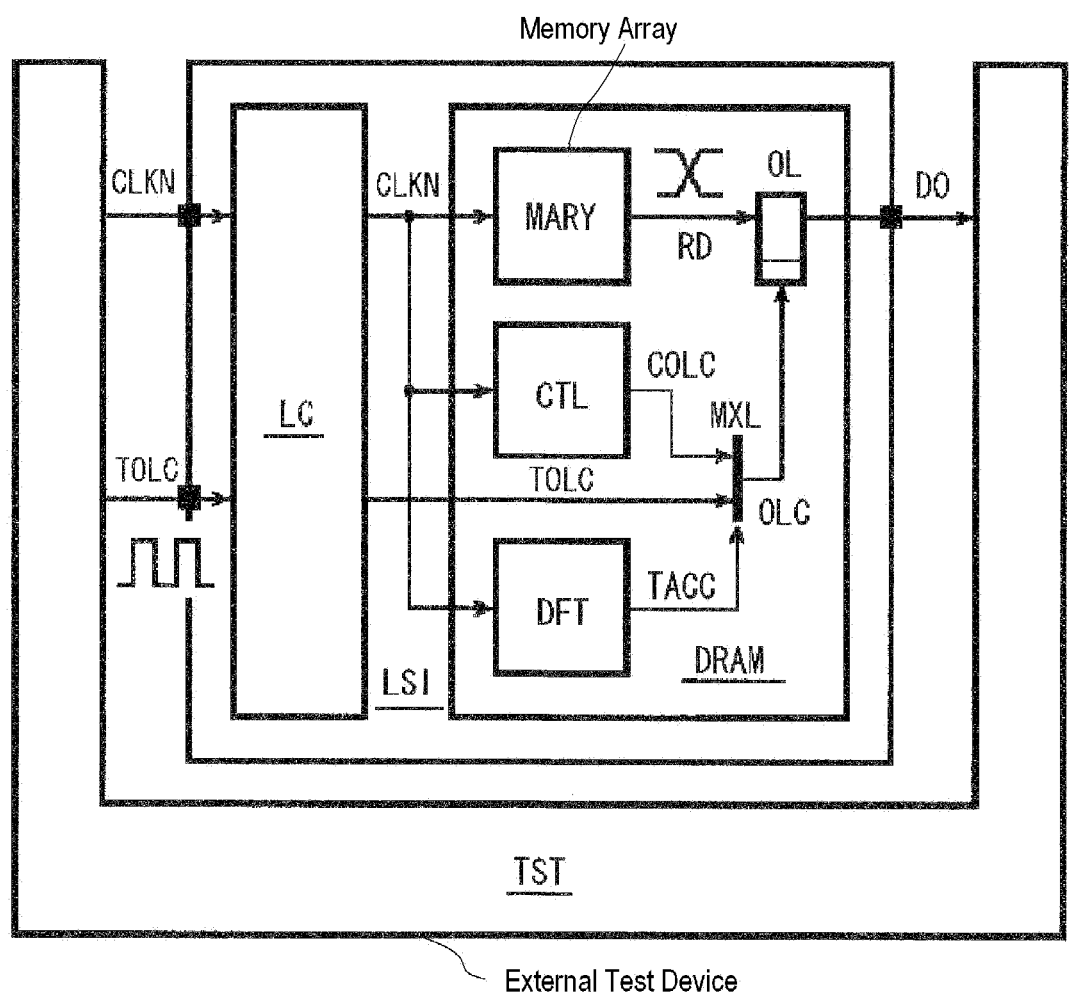
FIG. 10 is a block diagram schematically illustrating the configuration of a semiconductor integrated circuit device according to the prior art.
Figure 11:
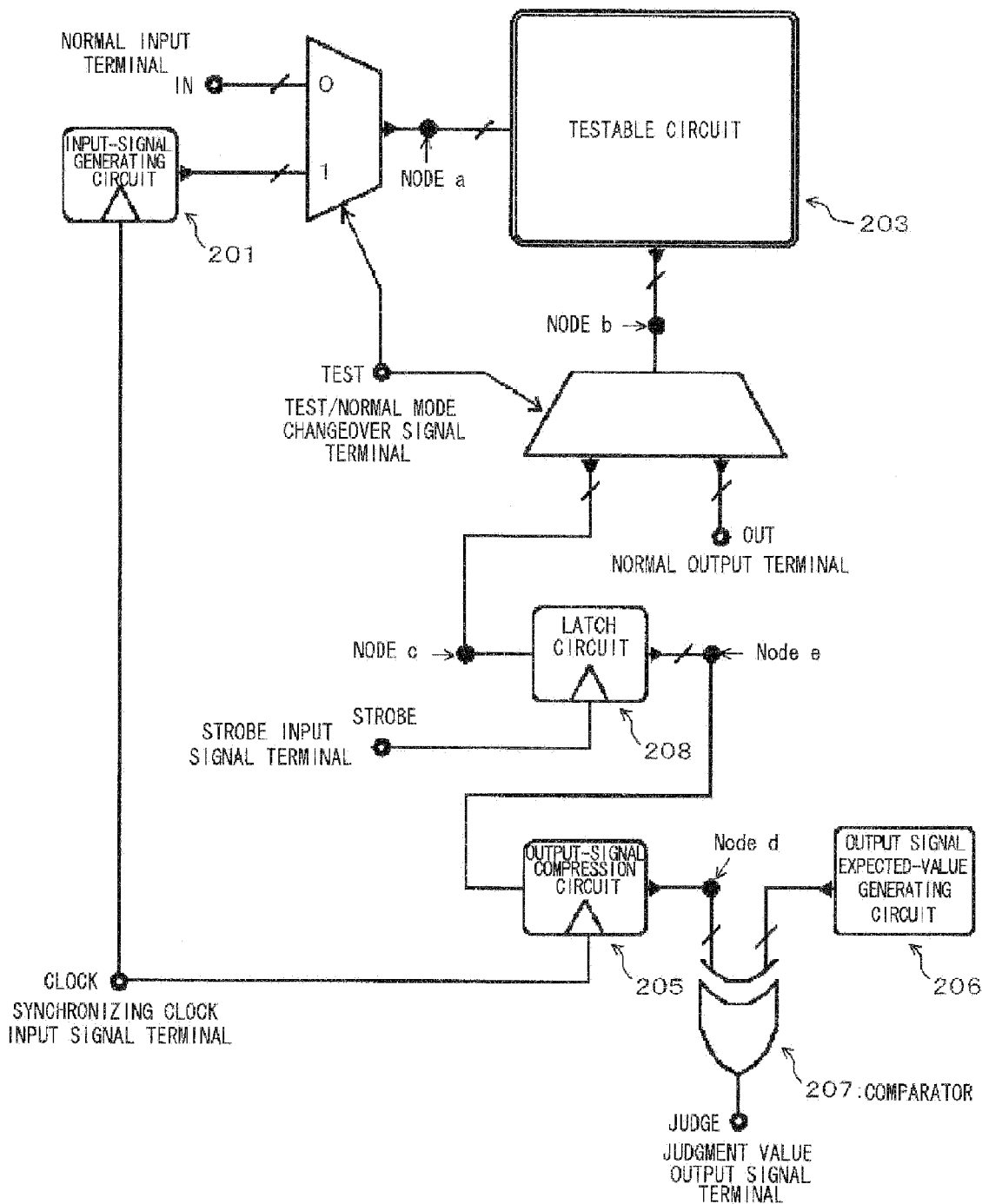
FIG. 11 is a block diagram schematically illustrating the configuration of a semiconductor device according to the prior art.

A semiconductor memory device according to a second embodiment of the present invention will now be described with reference to the drawings. FIG. 8 is a block diagram schematically illustrating the configuration of a memory macro in a semiconductor memory device according to the second embodiment of the present invention, and FIG. 9 is a timing chart illustrating the operation of the semiconductor memory device according to the second embodiment.

In the memory macro of the semiconductor memory device according to the second embodiment, two one-shot pulses in the external test signal TACC (a signal comprising an "H" pulse of a one-shot pulse) from the logic unit LC7 are input, whereupon a first TACC initial-stage circuit generates an "H" pulse signal (TACC2) that rises to "H" in response to the "H" edge and falls to "L" at the next "H" edge. The signal TACC2 is input to a second TACC initial stage, which proceeds to generate TACC0 and TACC1. Other aspects of the second embodiment are similar to those of the first embodiment.

In the first embodiment, the width of the "H" pulse of TACC and the width of the "H" pulse of TACC1 will no longer agree in a case where the path up to the point at which TACC enters the macro has a circuit for which the "L" to "H" transition time differ from the "H" to "L" transition time (a circuit for which the ratio of the transistors differs from that at ordinary circuit). In the second embodiment, however, the "H" pulse of TACC1 is decided by the "H" edges of the two one-shot pulses, and therefore the difference between the "L" to "H" and "H" to "L" transition times can be made to vanish (i.e., can be cancelled). As a result, it is possible for access time when a desired test is conducted to be expressed by the time between successive (neighboring) "H" edges in TACC. Measurement of access time is possible, particularly by changing, in terms of time, the latter "H" pulse of the two successive "H" pulses in TACC.

As many apparently widely different embodiments of the present invention can be made without departing from the spirit and scope thereof, it is to be understood that the invention is not limited to the specific embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor memory device comprising:
   a memory array; and
   a first input node, a second input node and a third input node each electrically connected to the memory array,
   wherein said first input node is configured to receive a first input signal, a read or write operation of the memory array in a normal mode is performed in accordance with the first input signal,
   wherein said second input node is configured to receive a second input signal, a read or write operation of the memory array in a test mode is performed in accordance with the second input signal,
   wherein a test of a plurality of output data from the memory array is conducted in the test mode to determine whether an access time is within a fixed period and results of the test are output at an output node, and
   wherein said device is so configured that said test is conducted in the test mode based upon a third input signal input to said third input node, said third input signal is unrelated to the first input signal and the second input signal.

2. The device according to claim 1, further comprising:
   a first initial-stage circuit that generates a prescribed signal based upon the third input signal and outputs the prescribed signal to the memory array;
   a replica unit that buffers and outputs output data from the memory array;
   a latch circuit that latches output data from said replica unit based upon the prescribed signal generated by said first initial-stage circuit;
   a first I/O compression circuit that compresses the output data from said latch circuit to a prescribed number, determines whether the compressed data are identical or not identical with one another and outputs test data resulting from the determination; and a second I/O compression circuit that compresses output data from said first I/O compression circuit to a single data and outputs, as a pass/fail flag signal, whether the compressed data value is identical or not identical with an expected value.

3. The device according to claim 2, further comprising a second initial-stage circuit to which the first and second input signals are input;
wherein said first initial-stage circuit generates a fourth signal based upon the third input signal;
the fourth signal is input to said second initial-stage circuit; and
said second initial-stage circuit is configured to output the fourth signal to the memory array when the test is conducted.

4. The device according to claim 3, wherein said first initial-stage circuit generates a fifth signal based upon the third input signal, and the fifth signal is input to said latch circuit.

5. The device according to claim 4, wherein the third input signal is an "H" pulse signal;
the fourth signal is a one-shot signal serving as an internal clock signal timed to an "H" edge of the third input signal; and
the fifth signal is a pulse signal having an "H" pulse width identical with that of the third input signal.

6. The device according to claim 2, further comprising an output unit that buffers the output data of the memory array and outputs the data to the exterior of the memory array;
wherein the device is so configured that an access path from an input pin of the second input signal to said latch circuit when the test mode is in effect is electrically equal in length to an access path from the input pin of the second input signal to an output pin of output data of said output unit when the normal mode is in effect.

7. The device according to claim 2, wherein it is possible for the access time when the test is conducted to be expressed by the "H" pulse width of the third input signal.

8. The device according to claim 2, wherein it is possible for the access time when the test is conducted to be measured by changing, in terms of time, an "L" edge of the third input signal.

9. The device according to claim 1, further comprising:
a third initial-stage circuit that generates a prescribed signal based upon the third input signal;
a fourth initial-stage circuit that generates a prescribed signal based upon an output signal from said third initial-stage circuit;
a replica unit that buffers and outputs output data from the memory array;
a latch circuit that latches output data from said replica circuit based upon a prescribed signal generated by a first initial-stage circuit;
a first I/O compression circuit that compresses the output data from said latch circuit to a prescribed number, determines whether the compressed data are identical or not identical with one another and outputs test data resulting from the determination; and
a second I/O compression circuit that compresses output data from said first I/O compression circuit to a single data and outputs, as a pass/fail flag signal, whether the compressed data value is identical or not identical with an expected value.

10. The device according to claim 9, wherein the third input signal is a signal comprising an "H" pulse of one-shot pulse; and said third initial-stage circuit generates a sixth signal that rises to the "H" level at the initial "H" edge of the third input signal and falls to the "L" level at the next "H" edge of the third input signal.

11. The device according to claim 9, wherein the access time when the test is conducted is expressed by the length of time between successive "H" edges of the third input signal.

12. The device according to claim 9, wherein the access time when the test is conducted is measured by changing, in terms of time, a latter "H" pulse of two successive "H" pulses of the third input signal.

13. A semiconductor memory device comprising:
means for performing a read or write operation of a memory array in a normal mode in accordance with a first input signal; and
means for performing a read or write operation of the memory array in a test mode in accordance with a second input signal;
wherein a test of a plurality of output data from the memory array is conducted in the test mode to determine whether an access time is within a fixed period and results of the test are output;
said device further comprising means for conducting the test in the test mode based upon a third input signal which is unrelated to the first input signal and the second input signal.

14. The device according to claim 13, comprising:
a first initial-stage circuit that generates a prescribed signal based upon the third input signal and outputs the prescribed signal to the memory array;
a replica unit that buffers and outputs output data from the memory array;
a latch circuit that latches output data from said replica unit based upon the prescribed signal generated by said first initial-stage circuit;
a first I/O compression circuit that compresses the output data from said latch circuit to a prescribed number, determines whether the compressed data are identical or not identical with one another and outputs test data resulting from the determination; and
a second I/O compression circuit that compresses output data from said first I/O compression circuit to a single data and outputs, as a pass/fail flag signal, whether the compressed data value is identical or not identical with an expected value.

15. The device according to claim 14, further comprising a second initial-stage circuit to which the first and second input signals are input;
wherein said first initial-stage circuit generates a fourth signal based upon the third input signal;
the fourth signal is input to said second initial-stage circuit; and
said second initial-stage circuit is configured to output the fourth signal to the memory array when the test is conducted.

16. The device according to claim 15, wherein said first initial-stage circuit generates a fifth signal based upon the third input signal, and the fifth signal is input to said latch circuit.

17. The device according to claim 16, wherein the third input signal is an "H" pulse signal;
the fourth signal is a one-shot signal serving as an internal clock signal timed to an "H" edge of the third input signal; and
the fifth signal is a pulse signal having an "H" pulse width identical with that of the third input signal.

18. The device according to claim 14, further comprising an output unit that buffers the output data of the memory array and outputs the data to the exterior of the memory array;

wherein the device is so configured that an access path from an input pin of the second input signal to said latch circuit when the test mode is in effect is electrically equal in length to an access path from the input pin of the second input signal to an output pin of output data of said output unit when the normal mode is in effect.

19. The device according to claim 14, wherein the access time when the test is conducted is expressed by the "H" pulse width of the third pulse signal; or wherein the access time when the test is conducted is measured by changing, in terms of time, an "L" edge of the third input signal.

* * * * *